(12) United States Patent
Lee et al.

(10) Patent No.: US 11,950,425 B2
(45) Date of Patent: Apr. 2, 2024

(54) SEMICONDUCTOR MEMORY DEVICE WITH MOLD STRUCTURE

(71) Applicant: SAMSUNG ELECTRONICS CO., LTD., Suwon-si (KR)

(72) Inventors: Myung Hun Lee, Seongnam-si (KR); Dong Ha Shin, Hwaseong-si (KR); Pan Suk Kwak, Goyang-si (KR); Dae Seok Byeon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 217 days.

(21) Appl. No.: 17/313,649

(22) Filed: May 6, 2021

(65) Prior Publication Data

US 2022/0115394 A1 Apr. 14, 2022

(30) Foreign Application Priority Data

Oct. 13, 2020 (KR) .......................... 10-2020-0131970

(51) Int. Cl.
| | |
|---|---|
| *H10B 43/50* | (2023.01) |
| *H01L 23/535* | (2006.01) |
| *H10B 41/27* | (2023.01) |
| *H10B 41/41* | (2023.01) |
| *H10B 41/50* | (2023.01) |

(Continued)

(52) U.S. Cl.
CPC .......... *H10B 43/50* (2023.02); *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(58) Field of Classification Search
CPC ........ H10B 43/50; H10B 41/27; H10B 41/41; H10B 41/50; H10B 43/27; H10B 43/40; H10B 43/10; H10B 43/35; H01L 23/535; H01L 21/76898; H01L 23/481; H01L 23/5226; H01L 25/0657; H01L 2225/06541
See application file for complete search history.

(56) References Cited

U.S. PATENT DOCUMENTS

| | | |
|---|---|---|
| 9,806,093 B2 | 10/2017 | Toyama et al. |
| 10,038,006 B2 | 7/2018 | Furihata et al. |

(Continued)

FOREIGN PATENT DOCUMENTS

CN 110190061 A * 8/2019 ........... H01L 23/585

*Primary Examiner* — Kyoung Lee
*Assistant Examiner* — Christina A Sylvia
(74) *Attorney, Agent, or Firm* — Fish & Richardson P.C.

(57) ABSTRACT

A mold structure includes gate electrodes stacked on a first substrate, a channel structure penetrating a first region of the mold structure to cross the gate electrodes, a first through structure penetrating a second region of the mold structure, and a second through structure penetrating a third region of the mold structure. The mold structure includes memory cell blocks extending in a first direction and spaced apart in a second direction, and a dummy block extending in the first direction and disposed between the memory cell blocks. Each of the memory cell and dummy blocks includes a cell region and an extension region arranged in the first direction. The first region is the cell region of one of the memory cell blocks, the second region is the extension region of the one of the memory cell blocks, and the third region is the extension region of the dummy block.

20 Claims, 14 Drawing Sheets

(51) Int. Cl.
*H10B 43/27* (2023.01)
*H10B 43/40* (2023.01)

(56) References Cited

U.S. PATENT DOCUMENTS

| | | | |
|---|---|---|---|
| 10,546,814 B2 | 1/2020 | Tak et al. | |
| 10,580,791 B1* | 3/2020 | Lee .................. | H10B 43/27 |
| 11,088,157 B2* | 8/2021 | Hwang .................. | H10B 41/27 |
| 2019/0139979 A1* | 5/2019 | Kanamori .............. | H10B 43/35 |
| 2019/0214404 A1* | 7/2019 | Ahn .................. | H01L 29/40117 |
| 2019/0371812 A1 | 12/2019 | Oike | |
| 2020/0027800 A1* | 1/2020 | Yamamoto ............. | H10B 41/50 |
| 2020/0152573 A1 | 5/2020 | Oh et al. | |
| 2022/0115394 A1* | 4/2022 | Lee .................. | H10B 43/50 |
| 2022/0231038 A1* | 7/2022 | Baek .................. | H01L 25/18 |
| 2022/0399367 A1* | 12/2022 | Kim .................. | H10B 41/35 |

* cited by examiner

SEMICONDUCTOR MEMORY DEVICE WITH MOLD STRUCTURE

CROSS-REFERENCE TO RELATED APPLICATION

This application claims priority under 35 U.S.C. 119 to Korean Patent Application No. 10-2020-0131970 filed on Oct. 13, 2020 in the Korean Intellectual Property Office, the subject matter which is hereby incorporated by reference.

BACKGROUND

1. Technical Field

The inventive concept relates generally to semiconductor memory devices and method of fabricating same. More particularly, the inventive concept relates to semiconductor memory devices including a stair-stepped extension region and methods of fabricating same.

2. Description of the Related Art

In order to satisfy consumer demands for superior performance and inexpensive prices, it is desired to increase the integration density of semiconductor devices. In a semiconductor memory device, since the integration density of the semiconductor memory device is an important factor in determining the price of a product, an increased integration density is particularly desirable.

In the case of a two-dimensional or planar semiconductor device, the integration density is mainly determined by the area occupied by a unit memory cell. Thus, the integration density is greatly influenced by the level of fine pattern formation. However, since extremely high-priced equipment is required for further miniaturize fine patterns, the integration density of the two-dimensional semiconductor devices has been increased but is still limited. Accordingly, three-dimensional semiconductor memory devices having memory cells that are three-dimensionally arranged have been proposed.

SUMMARY

Embodiments of the inventive concept provide semiconductor memory devices, and methods of fabricating same, that exhibit improved integration density and greater overall reliability.

In one embodiment, the inventive concept provides a semiconductor memory device including; a mold structure including gate electrodes stacked on a first substrate, a channel structure that penetrates a first region of the mold structure to cross the gate electrodes, a first through structure that penetrates a second region of the mold structure and a second through structure that penetrates a third region of the mold structure. The mold structure further includes; memory cell blocks extending in a first direction and spaced apart in a second direction, and a dummy block extending in the first direction and disposed between the memory cell blocks. Each the memory cell blocks and the dummy block includes a cell region and an extension region arranged in the first direction, the first region is the cell region of one of the memory cell blocks, the second region is the extension region of the one of the memory cell blocks, and the third region is the extension region of the dummy block.

In another embodiment, the inventive concept provides a semiconductor memory device including; a first mold structure stacked on a first substrate, an upper metal line disposed on the first mold structure, a second substrate disposed under the first substrate and including peripheral circuit elements, and a lower metal line disposed on the peripheral circuit elements. The first mold structure includes first memory cell blocks and a first dummy block, the first dummy block includes a cell region and an extension region including a contact region and an extension through region arranged in a first direction, and a first extension through via penetrating the extension through region to connect the upper metal line and the lower metal line, whereby a target signal from one of the peripheral circuit elements is transmitted to the upper metal line.

In another embodiment, the inventive concept provides a semiconductor memory device including; mold structures stacked on a first substrate and spaced apart from each other, wherein each of the mold structures including gate electrodes and first insulating patterns alternately stacked, block cutting areas extending in a first direction and separating the mold structures into memory cell blocks and a dummy block, wherein each of the memory cell blocks and the dummy block includes a cell region and an extension region, channel structures that penetrate one of the mold structures in the cell region of the memory cell block and the dummy block, through structures that penetrate the one of the mold structures in the extension region of the memory cell block, extension through structures that penetrate the one of the mold structures in the extension region of the dummy block, a second substrate including peripheral circuit elements respectively corresponding to the mold structures, and lower metal lines disposed between the peripheral circuit elements and the first substrate, wherein both one end of the extension through structure is connected to an upper metal line and another end of the extension through structure is connected to one of the lower metal lines to transmit a target signal to each one of the peripheral circuit elements.

BRIEF DESCRIPTION OF THE DRAWINGS

The above and other aspects and features of the inventive concept will become more apparent upon consideration of certain exemplary embodiments with reference to the attached drawings, in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Hereinafter, certain embodiments of the inventive concept will be described with reference to the accompanying drawings.

Figure 1:
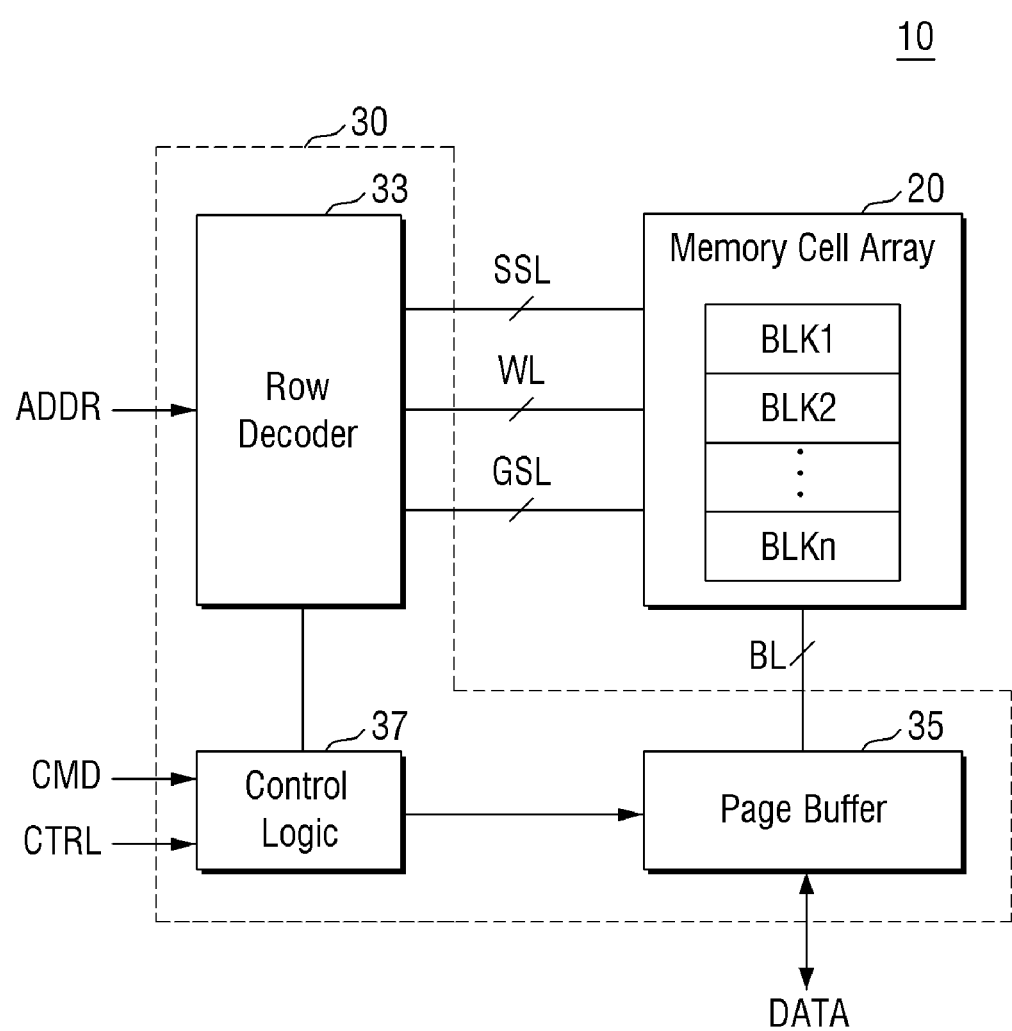
FIG. 1 is a block diagram illustrating a semiconductor memory device according to embodiments of the inventive concept.

FIG. 1 is a block diagram of a semiconductor memory device 10 according to embodiments of the inventive concept.

Referring to FIG. 1, the semiconductor memory device 10 generally includes a memory cell array 20 and a peripheral circuit 30.

The memory cell array 20 may include multiple memory cell blocks (e.g., BLK1 to BLKn, wherein 'n' is a positive integer greater than 1). Here, each the memory cell blocks BLK1 to BLKn may respectively include a plurality of memory cells. The memory cell blocks BLK1 to BLKn may be variously connected to the peripheral circuit 30 through bit lines BL, word lines WL, at least one of string select lines SSL, and at least one of ground select lines GSL.

In this regard, the memory cell blocks BLK1 to BLKn may be connected to a row decoder 33 through the word lines WL, at least one of the string select lines SSL, and at least one of the ground select lines GSL. Further, the memory cell blocks BLK1 to BLKn may be connected to a page buffer 35 through the bit lines BL.

The peripheral circuit 30 may receive one or more address(es) (ADDR), one or more command(s) (CMD), and one or more control signal(s) (CTRL) from external source(s), such as a memory controller, a processor or other external circuitry. The peripheral circuit 30 may also communicate (e.g., transmit and/or receive) data (DATA) with the external source(s). In certain embodiments, the peripheral circuit 30 may include control logic 37, the row decoder 33 and the page buffer 35.

Although not specifically shown in FIG. 1, the peripheral circuit 30 may further and variously include a range of conventionally understood circuitry, such as input/output (I/O) circuit(s), a voltage generator that generates various voltages required for operation of the semiconductor memory device 10, an error correction circuit that detects and/or corrects error(s) in the data being communicated to/from the memory cell array 20, etc.

In this regard, the control logic 37 may be connected to the row decoder 33, I/O circuit(s) and the voltage generator, such that the control logic 37 is able to control the overall operation of the semiconductor memory device 10. For example, the control logic 37 may generate various internal control signals used in the semiconductor memory device 10 in response to the control signal(s). The control logic 37 may also adjust various voltage level(s) selectively applied to the word lines WL and the bit lines BL during execution of a memory operation, such as a program (or write) operation, a read operation and an erase operation.

The row decoder 33 may be used to select one or more of the memory cell blocks BLK1 to BLKn in response to a received address. Further, the row decoder 33 may select at least one of the word lines WL, at least one of the string select lines SSL and at least one of the ground select lines GSL from a selected memory cell block. In this manner, the row decoder 33 may communicate various voltages associated with a memory operation to the word lines WL of the selected memory cell block.

The page buffer 35 may be connected to the memory cell array 20 through the bit lines BL. The page buffer 35 may alternately operate as a writer driver or as a sense amplifier. That is, during the program operation, the page buffer 35 may operate as a write driver to apply to the bit lines BL a voltage corresponding to write data to be stored in the memory cell array 20. Alternately, during the read operation, the page buffer 35 may operate as a sense amplifier to sense the read data stored in the memory cell array 20.

Figure 2:
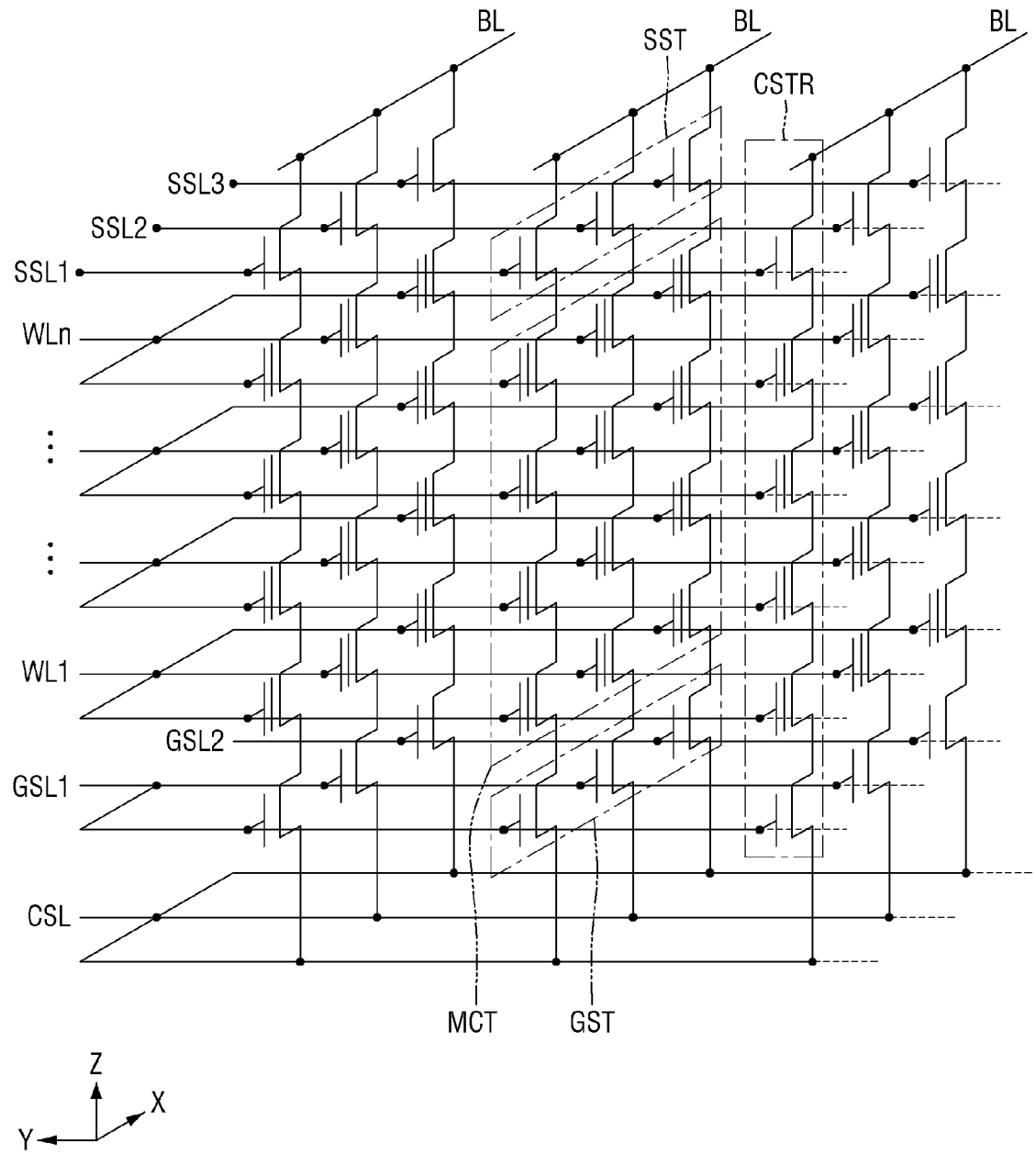
FIG. 2 is a partial circuit diagram further illustrating in one example the semiconductor memory device of FIG. 1.

FIG. 2 is a partial circuit diagram further illustrating in one example the memory array 20 of FIG. 1.

Referring to FIG. 2, the memory cell array 20 may include common source line(s) CSL, bit lines BL and cell strings CSTR.

The bit lines BL may be arranged two-dimensionally (i.e., in a horizontal plane defined by a first horizontal direction (e.g., the 'X direction') and a second horizontal direction (e.g., the 'Y direction')). Here, for example, the bit lines BL may be spaced apart in the Y direction and extend in the first direction X. The cell strings CSTR may extend in the vertical direction (e.g., the 'direction') and be connected in parallel to each of the bit lines BL. The cell strings CSTR may be commonly connected to the common source lines CSL. That is, the cell strings CSTR may be interposed between one of the bit lines BL and one of the common source lines CSL.

The common source lines CSL may also be arranged two-dimensionally. For example, the common source lines CSL may be spaced apart in the X direction and extend in the Y direction. The same voltage may be applied to the common source lines CSL. Alternatively, different voltages may be applied to the common source lines CSL when separately controlled.

In some embodiments, each of the cell strings CSTR may include ground select transistors GST connected to the common source line CSL, string select transistors SST connected to the bit line BL, and memory cell transistors MCT interposed between the ground select transistors GST and the string select transistors SST. Each of the memory cell transistors MCT may include a data storage element. The ground select transistors GST, the string select transistors SST, and the memory cell transistors MCT may be connected in series.

The common source line CSL may be commonly connected to the sources of the ground select transistors GST. Further, ground select lines GSL1 and GSL2, a plurality of word lines WL1 to WLn, and string select lines SSL1 to SSL3 may be interposed between the common source line CSL and the bit line BL.

The ground select lines GSL1 and GSL2 may be used as a gate electrode of the ground select transistor GST. The plurality of word lines WL1 to WLn may be used as gate electrodes of the memory cell transistors MCT. The string select lines SSL1 to SSL3 may be used as gate electrodes of the string select transistors SST.

In some embodiments, one ground select line (e.g., the ground select line GSL1) may correspond to two string select lines (e.g., the string select lines SSL1 and SSL2). For example, the cell strings CSTR connected to the first string select line SSL1 and the second string select line SSL2 may be commonly connected to the first ground select line GSL1.

Figure 3:
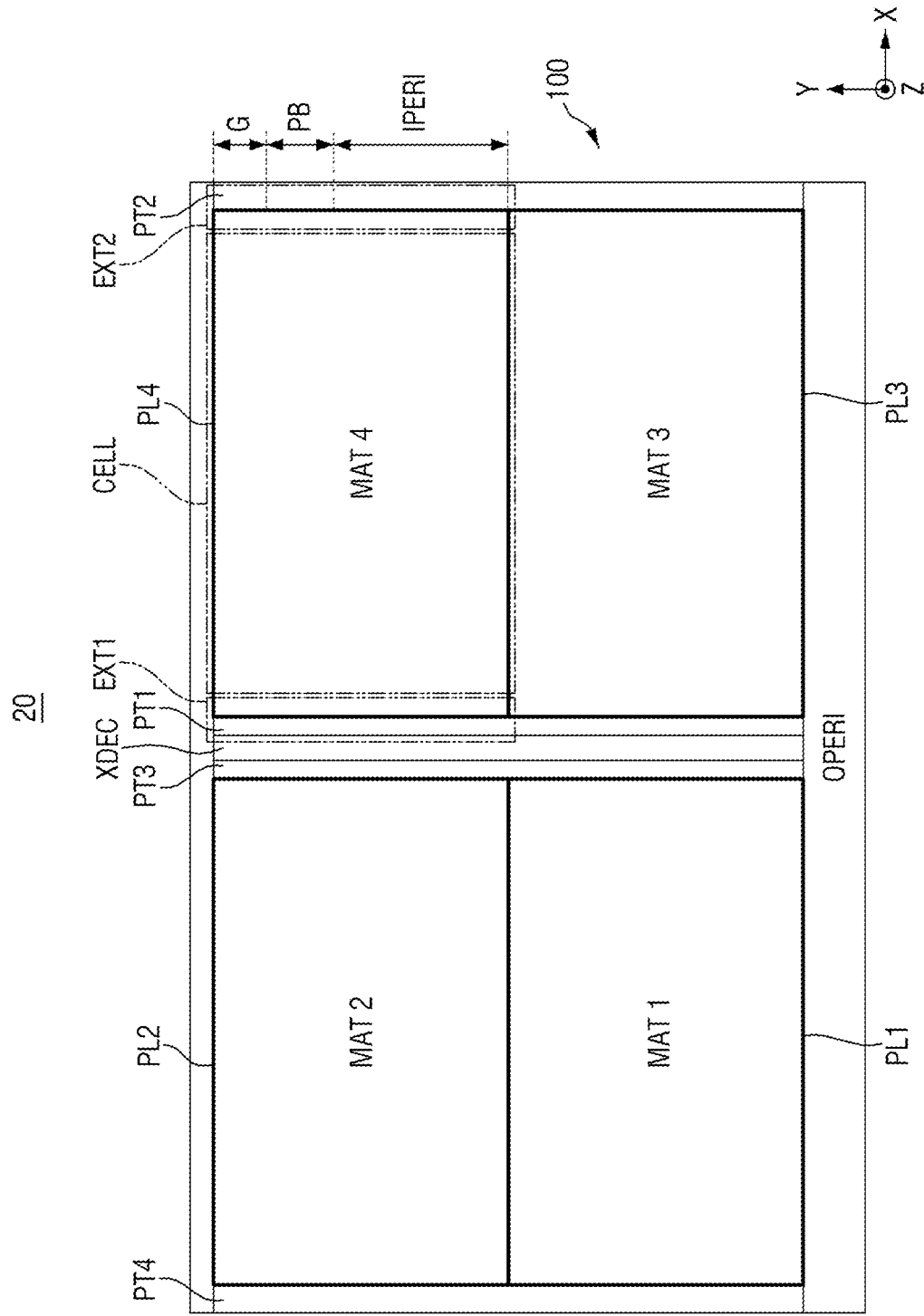
FIG. 3 is a plan (or top-down) view further illustrating in one example the memory cell array 20 of FIG. 1.
Figure 4:
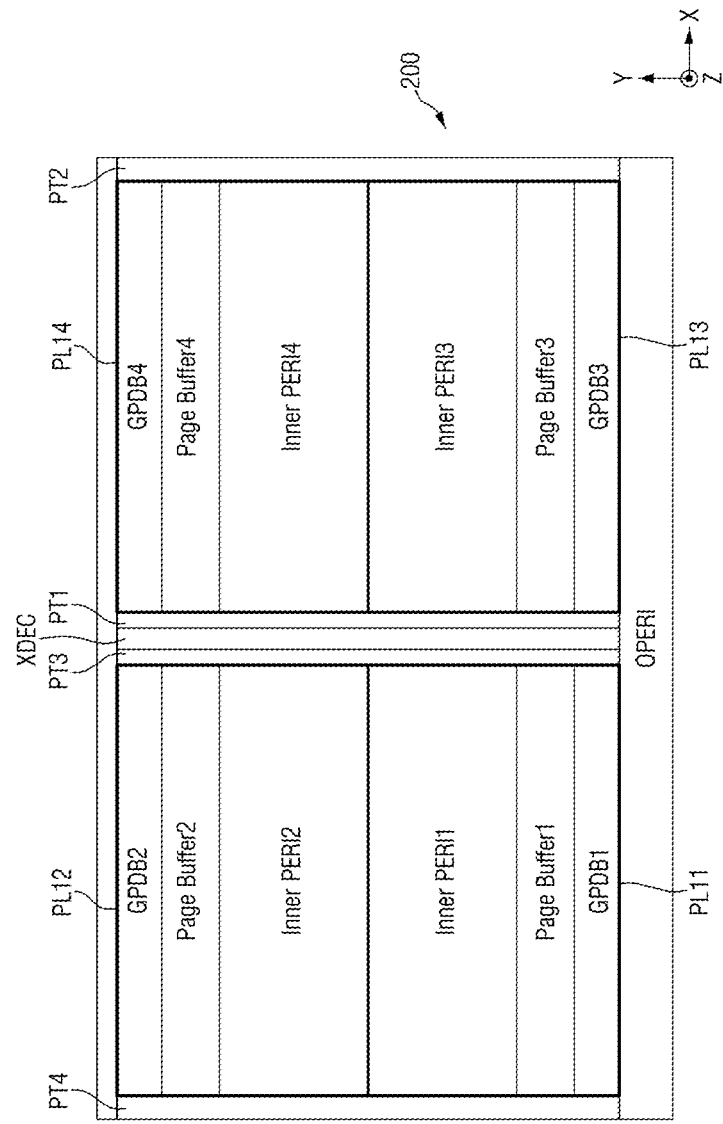
FIG. 4 is a plan view further illustrating in one example the peripheral circuit 30 of FIG. 1.

FIG. 3 is a plan (or top-down) diagram further illustrating in one example the memory cell array 20 of FIG. 1, and FIG. 4 is a plan diagram further illustrating in one example the peripheral circuit 30 of FIG. 1.

Here, it is assumed that the semiconductor memory device 10 of FIG. 1 includes a first planar substrate 100 and a second planer substrate 200, wherein the memory cell array 20 is substantially provided on a first substrate 100 (see, e.g., FIG. 3) and the peripheral circuit 30 is substantially provided on a second substrate 200 (see, e.g., FIG. 4). In some embodiments, the first substrate 100 may be vertically disposed on the second substrate 200.

Figure 6:
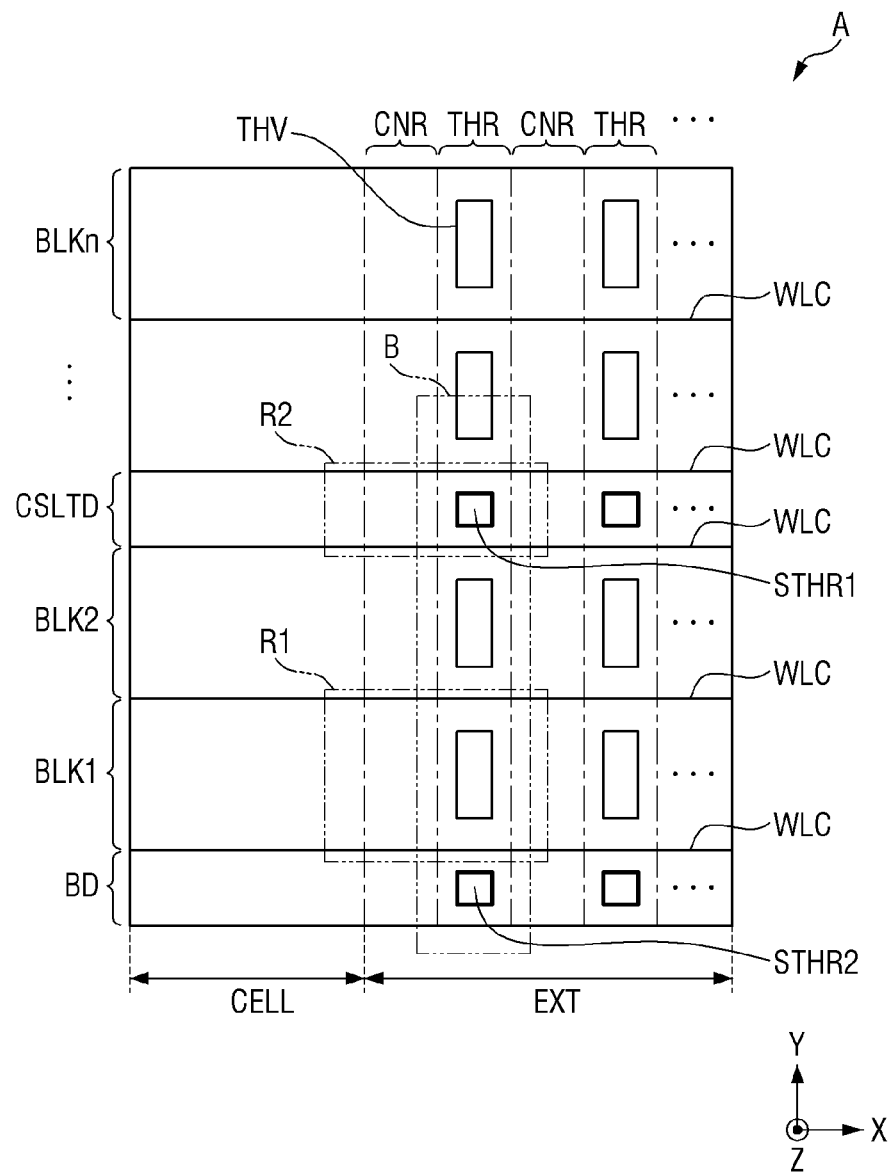
FIG. 6 is a plan view further illustrating the area 'A' indicated in FIG. 5.
Figure 9:
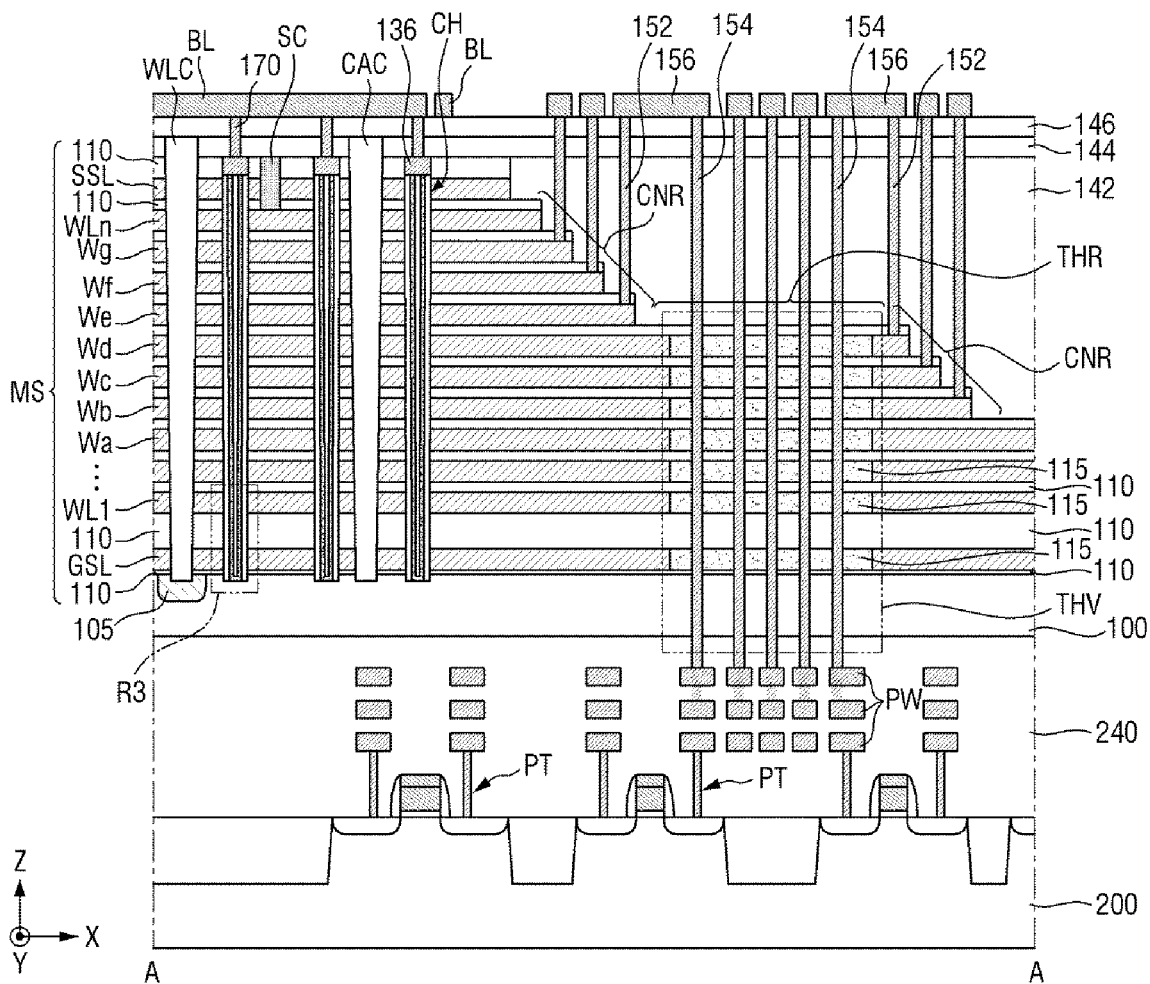
FIG. 9 is a cross-sectional view taken along line A-A of FIG. 8.

Referring to FIG. 3, the first substrate 100 may include mold structures MS (see, e.g., FIGS. 6 and 9). Each of the mold structures may be substantially disposed in a single plane, and may include a plurality of memory cell blocks. In some embodiments, the first substrate 100 may be implemented as a horizontal semiconductor layer. One example of a mold structure will be described in some additional detail with reference to FIG. 6 and subsequent drawings.

The first substrate 100 may include one or more MAT(s), wherein one or more mold structure(s) may be mounted on each MAT. In FIG. 3, for example, a rectangular arrangement of four(4) MATs is shown. For clarity of illustration, only a single mold structure will be shown mounted on a MAT, however, the scope of the inventive concept is not limited thereto.

In some embodiments like the one illustrated in FIG. 3, each one of four planes (e.g., PL1, PL2, PL3 and PL4—hereafter collectively, PL1 to PL4) may include a cell region CELL bracketed on opposing sides by a first extension region EXT1 and a second extension region EXT2 in the X direction. One example of the first extension region EXT1 and the second extension region EXT2 will be described in some additional detail with reference to FIG. 6 and subsequent drawings.

Referring to FIG. 4, the second substrate 200 may include an arrangement of one or more sub-peripheral regions (e.g., PL11, PL12, PL13 and PL14—hereafter collectively, PL11 to PL14); one or more pass transistors (e.g., PT1, PT2, PT3 and PT4—hereafter collectively, PT1 to PT4), as well as a row decoder (XDEC), and an output pad (OPERI). In some embodiments, the second substrate 200 may be implemented as a peripheral logic structure layer, and in some embodiments, the peripheral circuit 30 may be implemented in relation to for each plane of the memory cell array 20.

Each one of the sub-peripheral regions PL11 to PL14 may include one or more inner peripheral circuits (e.g., IPeri1, Iperi2, Iperi3 and IPeri4—hereafter collectively, IPeri1 to IPeri4); one or more page buffers (e.g., Page Buffer 1, Page Buffer 2, Page Buffer 3 and Page Buffer 4—hereafter collectively, Page Buffer 1 to Page Buffer 4); and one or more one or more GPBD structures (e.g., GPBD1, GPBD2, GPBD3 and GPBD4). Here, the inner peripheral circuits (IPeri) may include a portion of the control logic 37, a portion of a voltage generator, a charge pump, an oscillator, or the like.

In some embodiments, one of the pass transistors PT1 to PT4 may be disposed along one side of each one of the MATs (e.g., MAT1 to MAT4) in accordance with the arrangement of pass transistors PT1 to PT4 with respect to the sub-peripheral regions PL1 to PL4. For example, the pass transistor PT1 may be disposed along one side of the sub-peripheral regions PL4 corresponding to the MAT4, and the pass transistor PT2 may be disposed on the other side of the sub-peripheral regions PL4 corresponding to the MAT4.

In some embodiments, the row decoder XDEC (e.g., the row decoder 33 of FIG. 1) may be disposed between adjacent, horizontally-disposed (e.g., in the X direction) sets of mats (e.g., between a first set including MAT1 and MAT3 and/or between a second set of mats including MAT2 and MAT4).

Thus, in some embodiments, the pass transistors PT1 and PT3 and the pass transistors PT2 and PT4 may be variously connected to the MATs of the memory cell array according to block units.

In some embodiments, the row decoder XDEC may transfer a signal to the memory cell array 20 of the first substrate 100, an inner peripheral circuit (Inner Peri), a page buffer, and/or a GPBD structure through the pass transistors PT1 to PT4. The pass transistors PT1 to PT4 may be connected to I/O terminals of an inner peripheral circuit (Inner Peri), the page buffer, and the GPBD structure may connect a signal to a peripheral circuit corresponding to another MAT or to transfer an I/O signal from a page buffer to the output pad (OPERI).

In some embodiments, a signal originating in a peripheral circuit element may be transferred to an upper metal line (e.g., "upper wiring") through a peripheral circuit wiring PW (See, e.g., FIG. 9) and an extension through via. Alternately, a common source line signal may be transferred to the source line of the ground select transistor of an adjacent block. Alternately, a power supply signal may be shared by the dummy block and the cell block.

Figure 5:
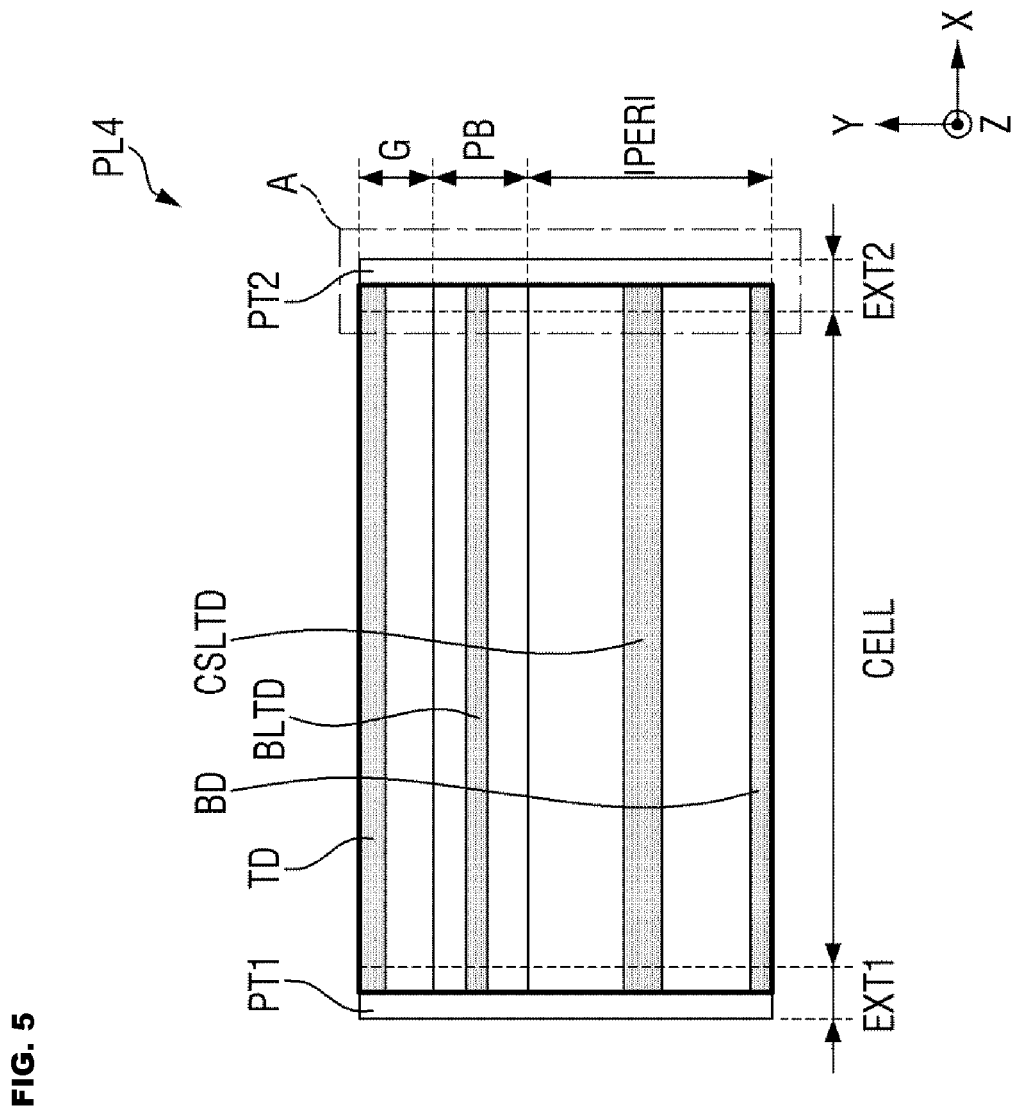
FIG. 5 is a plan view further illustrating the plane PL4 of FIGS. 3 and 4.
Figure 7:
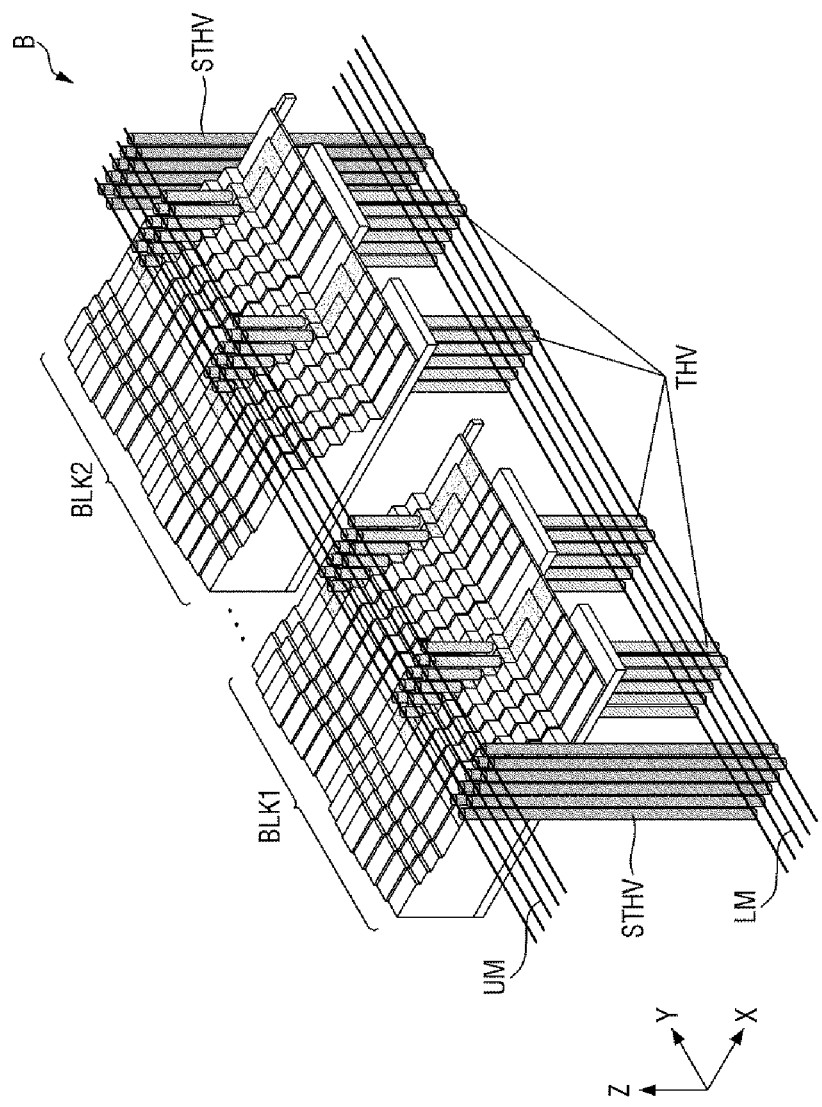
FIG. 7 is a perspective view further illustrating the area 'B' indicated in FIG. 6.

FIG. 5 is a plan view further illustrating the plane PL4 of FIGS. 3 and 4, FIG. 6 is a plan view further illustrating the area 'A' indicated in FIG. 5, and FIG. 7 is a perspective view further illustrating the area 'B' indicated in FIG. 6.

As previously noted in relation to FIG. 3, the top surface of the first substrate 100 may include the cell region CELL horizontally bracketed (e.g., in the X direction) by the first extension region EXT1 and the second extension region EXT2. Here, the X direction is assumed to be a direction in which word lines extend, and the first and second extension regions EXT1 and EXT2 are disposed on opposing both sides of the cell region CELL.

Referring to FIGS. 1, 3, 4, 5 and 6, the semiconductor memory device 10 including the cell region CELL and the first and second extension regions EXT1 and EXT2 may further include block separation areas WLC that may be used to designate the memory cell blocks BLK1 to BLKn by physically cutting potions of the cell region CELL and the first and second extension regions EXT1 and EXT2. In this regard, the block separation areas WLC may extend in the X direction to cut the cell region CELL and the first and second extension regions EXT1 and EXT2.

As previously noted the memory cell array 20 includes memory cells variously arranged in the cell region CELL. For example, a channel structure CH, bit lines BL, and the like, which will be described in some additional hereafter, may be used to form the cell region CELL.

Each extension region EXT (e.g., among the first extension region EXT1 and the second extension region EXT2) may be disposed proximate to the cell region CELL. In some embodiments, the cell region CELL and an extension region EXT may be arranged in a direction in which the block separation areas WLC extend (e.g., the X direction).

In this regard, the extension region EXT may include the first extension region EXT1 corresponding to the first pass transistor PT1 adjacent to the row decoder XDEC of the second substrate 200, and the second extension region EXT2 corresponding to the second pass transistor PT2 on an opposing side of the cell region CELL.

In some embodiments, referring to FIGS. 5, 6 and 7, the memory cell blocks BLK1 to BLKn formed on the first substrate 100 may include at least one dummy block. In some embodiments, the dummy block may include at least one of a top dummy block (TD), a bottom dummy block (BD), a CSL tapping dummy block (CSLTD), and a bit line through structure dummy block (BLTD).

In some embodiments, the dummy block may be disposed between adjacent memory cell blocks among the memory cell blocks BLK1 to BLKn (i.e., a general cell block), and/or disposed outside the general cell block. The dummy block may also be cut by the block isolation areas WLC in contrast to the memory cell blocks of the general cell block. For example, the CSL tapping dummy block CSLTD of FIG. 6 may be disposed between the adjacent general cell blocks BLK2 and BLK3, and the bottom dummy block BD may be disposed on a bottom surface of the general cell block (e.g., under the first memory cell block BLK1 and in the edge region of the fourth plane PL4).

Here, the top dummy block TD and the bottom dummy block BD may be at least one dummy block extending in the X direction in the edge region of one mold structure MS (e.g., in the fourth plane PL4, and not in the first and second extension regions EXT1 and EXT2).

The CSL tapping dummy block CSLTD may be a dummy block adjacent to the tapping block for connecting the memory cell block to the common source line CSL in the fourth plane PL4. The CSL tapping dummy block CSLTD may extend in the X direction across the cell region CELL and the first and second extension regions EXT1 and EXT2 on the first substrate 100 corresponding to the inner peripheral circuit IPERI of the second substrate 200.

The bit line through structure dummy block BLTD is an area adjacent to the area where a bit line through structure BL THV for connecting the bit line BL of the memory cell block to the page buffer PB in the sub-peripheral region PL14 is formed. The bit line through structure dummy block BLTD may extend in the X direction across the cell region CELL and the first and second extension regions EXT1 and EXT2 on the first substrate 100 corresponding to the page buffer PB of the second substrate 200 in the sub-peripheral region PL14.

In the extension region EXT, gate electrodes GSL, the word lines WL1 to WLn, and the string select line SSL may be vertically stacked in a stair-stepped manner as shown in FIG. 7.

In this regard, the extension region EXT may include a contact region CNR and through regions THR and STHR. Here, the contact region CNR and the through regions THR and STHR may be arranged alternately along the direction in which the block separation area WLC extends (e.g., the X direction).

Gate contacts 152 (see, e.g., FIG. 9) connected to the respective gate electrodes GSL, the word lines WL1 to WLn, and string select line SSL may be formed in the contact region CNR of the extension region EXT. Further, through structures THV and STHV may be respectively formed in the through regions THR and STHR of the extension region EXT. The contact region CNR and the through regions THR and STHR will be described in some additional detail with reference to FIGS. 8, 9 and 10.

Figure 8:
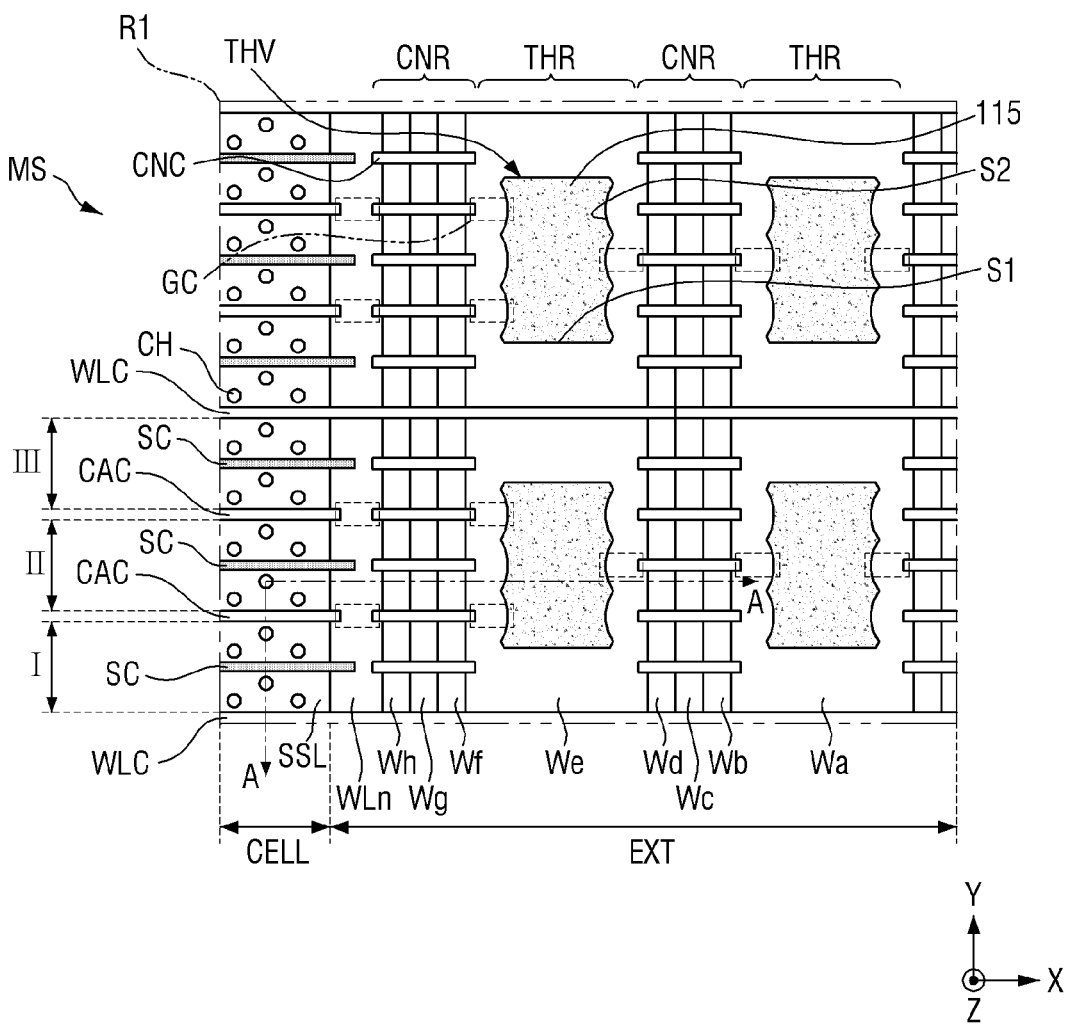
FIG. 8 is a plan view showing a layout that further illustrates the area 'R1' indicated in FIG. 6.

FIG. 8 is a plan view showing a layout diagram further illustrating the area 'R1' of FIG. 6, and FIG. 9 is a cross-sectional view taken along line A-A of FIG. 8.

Referring to FIGS. 8 and 9, portions of the general memory cell block are illustrated, as compared with dummy block(s). Here, the semiconductor memory device of FIGS. 1 and 2 including the first substrate 100, bit lines BL and the mold structure MS may further include a channel structure CH, a block separation area WLC, a cell gate cutting area CAC, an extension gate cutting area CNC, a through structure THV, a gate contact 152 and a first through via 154.

The first substrate 100 may include, for example, a semiconductor substrate such as a silicon substrate, a germanium substrate, or a silicon-germanium substrate. Alternatively, the first substrate 100 may include a silicon-on-insulator (SOI) substrate or a germanium-on-insulator (GOI) substrate.

In some embodiments, the first substrate 100 may include an impurity area 105, wherein the impurity area 105 may extend in the second direction Y and be provided as a common source line (e.g., CSL in FIG. 2) within the semiconductor memory device.

The mold structure MS may be formed on the first substrate 100 of the cell region CELL and the extension region EXT. As shown in FIGS. 7 and 9, the mold structure MS may be formed in a stair-stepped arrangement on the first substrate 100 of the extension region EXT.

The mold structure MS may be formed on the first substrate 100. The mold structure MS may include the gate electrodes GSL, the word lines WL1 to WLn, the string select line SSL and first insulating patterns 110 which are alternately stacked on the first substrate 100. For example, each of the gate electrodes GSL, the word lines WL1 to WLn, and the string select lines SSL as well as each of the first insulating patterns 110 may have a layered structure extending in the first direction X and the second direction Y. The gate electrodes GSL, the word lines WL1 to WLn, the string select line SSL and the first insulating patterns 110 may be alternately stacked in the vertical direction (e.g., the Z direction) perpendicular to a top surface of the first substrate 100. Accordingly, the gate electrodes GSL, the word lines WL1 to WLn, and the string select line SSL may be spaced apart from each other and vertically stacked on the first substrate 100.

In some embodiments, the gate electrodes GSL, the word lines WL1 to WLn, and the string select line SSL may include a ground select line GSL, wherein the word lines WL1 to WLn and a string select line SSL are sequentially stacked on the first substrate 100. In some embodiments, the ground select line GSL may be a gate electrode disposed at the bottom of the gate electrodes GSL, word lines WL1 to WLn, and the string select line SSL. Further, in some embodiments, the string select line SSL may be a gate electrode disposed at a top of the gate electrodes GSL, the word lines WL1 to WLn, and the string select line SSL.

The mold structure MS of FIG. 8 is shown as including only one ground select line GSL and one string select line SSL, but this is merely one possible arrangement. For example, the mold structure may multiple ground select lines GSL and/or multiple string select lines SSL.

The gate electrodes GSL, the word lines WL1 to WLn, and the string select line SSL may include, for example, one or more metal(s), such as tungsten (W), cobalt (Co), and nickel (Ni), or a semiconductor material such as silicon, but are not limited thereto. The gate electrodes GSL, the word lines WL1 to WLn, and the string select line SSL may be formed by, for example, a replacement process, but are not limited thereto.

The first insulating pattern 110 may include an insulating material. For example, the first insulating pattern 110 may include oxide (e.g., silicon oxide), but is not limited thereto.

The channel structure CH may penetrate the mold structure MS. That is, in the illustrated example of FIG. 8, the channel structure CH may vertically extend in a direction that crosses the gate electrodes GSL, the word lines WL1 to WLn, and the string select line SSL. In this regard, the channel structure CH may have a pillar shape (e.g., a cylindrical shape) extending in a Z direction. Examples of the channel structure CH will be described in some additional detail in relation to FIGS. 13 and 14.

In some embodiments, each channel structure CH may further include a channel pad 136. The channel pad 136 may be formed to be connected to an upper portion of the semiconductor pattern 130. For example, the channel pad 136 may be formed in the first insulating pattern 110 on the uppermost gate electrode (e.g., the string select line SSL) and connected to the semiconductor pattern 130. The channel pad 136 may include, for example, polysilicon doped with impurities, but is not limited thereto.

In some embodiments, channel structures CH may be arranged in a zigzag shape. For example, as shown in FIG. 8, the channel structures CH may be arranged to be misaligned with each other in the X direction and the Y direction. In this regard, the channel structures CH may be arranged in a zigzag shape to improve the integration density of the semiconductor memory device.

A bit line BL may be formed on the mold structure MS. For example, the bit line BL may be formed on first, second and third interlayer insulating films 142, 144, and 146 that are sequentially stacked on the mold structure MS (see, e.g., FIG. 10).

Figure 10:
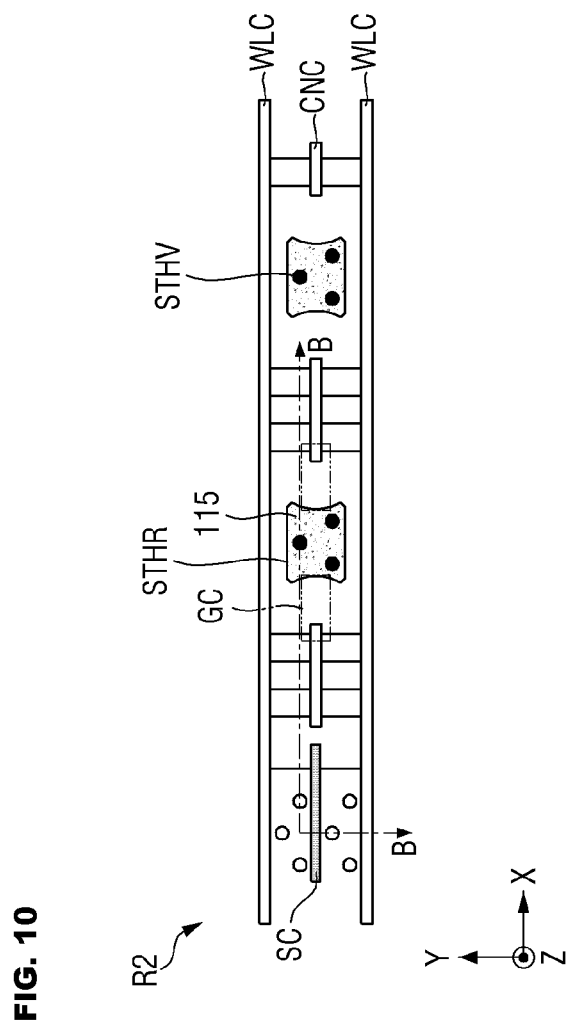
FIG. 10 is a plan view showing a layout that further illustrates the area 'R2' indicated in FIG. 6, and FIGS. 11 and 12 are respective cross-sectional diagram taken along line B-B in FIG. 10.

The bit line BL may extend in the first direction X and be connected to the channel structures CH. For example, as illustrated in FIGS. 9 and 10, the bit line BL may be connected to the channel structures CH through bit line contacts 170. The bit line contacts 170 may, for example, penetrate the first to third interlayer insulating films 142, 144, and 146 to electrically connect the bit line BL to the channel structures CH.

The block separation area WLC may be formed in the cell region CELL and the extension region EXT to cut the gate electrodes GSL, the word lines WL1 to WLn, and the string select SSL. Further, the block separation area WLC may extend in a direction crossing the bit line BL. For example, the block separation areas WLC may be arranged in the cell region CELL and the extension region EXT while being spaced apart from each in the Y direction. Each of the block separation areas WLC may extend in the X direction to cut the mold structure MS.

As described above in relation to FIG. 8, the block separation area WLC may cut the cell region CELL and the extension region EXT to form individual memory cell blocks (e.g., memory cell blocks BLK1 to BLKn). For example, each of the block separation areas WLC may be elongated in the X direction to completely cut the mold structure MS. Thus, the mold structure MS cut by two adjacent block separation areas WLC into individual memory cell blocks among the memory cell blocks BLK1 to BLKn.

The cell gate cutting area CAC may be formed in the cell region CELL to cut the gate electrodes GSL, the word lines WL1 to WLn, and the string select line SSL. Further, the cell gate cutting area CAC may extend in a direction crossing the bit line BL. For example, the cell gate cutting areas CAC may be arranged along the Y direction in the cell region CELL. Each of the cell gate cutting areas CAC may extend in the X direction to cut the mold structure MS in the cell region CELL.

The cell gate cutting areas CAC may cut the cell region CELL to form zones I, II, and III in one of the memory cell blocks BLK1 to BLKn of the cell region CELL. For example, eight (8) cell gate cutting areas CAC may be formed within two (2) adjacent block separation areas WLC. Accordingly, three (3) zones (e.g., first, second and third zones I, II, and III) may be formed in the two adjacent block separation areas WLC.

The extension gate cutting area CNC may be formed in the extension region EXT to cut the gate electrodes GSL, the word lines WL1 to WLn, and the string select line SSL. Further, the extension gate cutting area CNC may extend in a direction crossing the bit line BL. For example, extension gate cutting areas CNC may be arranged in the extension region EXT along the Y direction. Each of the extension gate cutting areas CNC may extend in the X direction to cut the mold structure MS in the extension region EXT.

In some embodiments, at least part of the extension gate cutting area CNC may be arranged to overlap the cell gate cutting area CAC in the Y direction. For example, as illustrated in FIG. 8, five (5) extension gate cutting areas CNC may be formed in two (2) adjacent block separation areas WLC. Among the five (5) extension gate cutting areas CNC, two (2) extension gate cutting areas CNC may overlap the cell gate cutting area CAC in the second direction Y.

In some embodiments, the extension gate cutting area CNC may be formed in the contact region CNR of the extension region EXT without being formed in the through regions THR and STHR of the extension region EXT. For example, the extension gate cutting area CNC may extend in the X direction without penetrating into the through regions THR and STHR.

The block separation area WLC, the cell gate cutting area CAC, and the extension gate cutting area CNC may include, for example, at least one of silicon oxide, silicon nitride, silicon oxynitride, and a low dielectric constant (low-k) material having a lower dielectric constant than silicon oxide, but are not limited thereto.

In some embodiments, the block separation area WLC, the cell gate cutting area CAC, and the extension gate cutting area CNC may be formed at the same level. In this context, the phrase "formed at the same level" is used to denote disparate elements formed at a substantially similar height with respect to an arbitrarily selected horizontal plane (e.g., a selected surface of a substrate). For example, the block separation area WLC, the cell gate cutting area CAC, and the extension gate cutting area CNC may contain the same insulating material.

In some embodiments, the block separation area WLC may include a conductive material. For example, the block separation area WLC may include a conductive pattern and a spacer that separates the mold structure MS from the conductive pattern. The block separation area WLC including the conductive pattern may be connected to the impurity area 105 to be provided as a common source line (e.g., CSL in FIG. 2) of the semiconductor memory device.

In some embodiments, a cutting structure SC may be formed in the mold structure MS of the cell region CELL to cut the string select line SSL. The cutting structure SC may be interposed between the block separation areas WLC to cut the string select line SSL of the mold structure MS. For example, a plurality of cutting structures SC may be arranged in the cell region CELL along the Y direction. Each of the cutting structures SC may extend in the X direction to cut the string select line SSL.

In some embodiments, the cutting structures SC may be interposed between the block separation area WLC and the cell gate cutting area CAC. For example, referring to FIG. 8, the cutting structures SC may be interposed between the block separation area WLC defining the first, second and third zones I, II, and III and the cell gate cutting area CAC. Accordingly, each of the first, second and third zones I, II, and III may provide two (2) string select lines SSL that are electrically separated and may be separately controlled.

Accordingly, the string select line SSL of the first zone I and the string select line SSL of the second zone II may be electrically separated and separately controlled. Further, the string select line SSL of the second zone II and the string select line SSL of the third zone III may be electrically separated and separately controlled. That is, six (6) string select lines SSL may be formed (as one possible example) within two (2) adjacent block separation areas WLC.

In some embodiments, the number of extension gate cutting areas CNC formed in adjacent block isolation areas WLC may be less than or equal to a number of cutting structures SC formed in adjacent block isolation areas WLC. For example, five (5) cutting structures SC and five (or fewer) extension gate cutting areas CNC may be formed in adjacent block separation areas WLC.

The through structure THV may be formed in the through region THR of the extension region EXT. The through structure THV may include second insulating patterns 115 vertically stacked on the first substrate 100 and spaced apart from each other. For example, each of the second insulating patterns 115 may be a layered structure extending in the X direction and the Y direction.

The second insulating patterns 115 may be formed at the same level as at least one of the gate electrodes GSL, the wordlines WL1 to WLn, and the string select line SSL. For example, as shown in FIG. 9, the second insulating patterns 115 may be formed at the same level as the gate electrode (e.g., the gate electrode We) exposed in the through region THR and the gate electrodes disposed below (e.g., the gate electrodes GSL, WL1, and Wa to Wd).

Further, the second insulating patterns 115 in the through region THR and the first insulating patterns 110 may be alternately stacked. In other words, the second insulating patterns 115 may cut the gate electrodes GSL, the word lines WL1 to WLn, and the string select line SSL in the through region THR.

In some embodiments, the second insulating pattern 115 may have first side surfaces S1 that are straight (or planar) and second side surfaces S2 that are curved (or non-planar) when viewed in plan. For example, as shown in FIG. 8, the second insulating pattern 115 may have the first side surfaces S1 extending in the second direction Y. Further, the second insulating pattern 115 may have the concave second side surfaces S2.

In some embodiments, the second side surfaces S2 of the second insulating pattern 115 may form arcs with respect to one ends of the extension gate cutting areas CNC. For example, the second side surfaces S2 of the second insulating pattern 115 may form a arcs arranged along the first direction X to correspond to the extension gate cutting areas CNC arranged along the first direction X.

The second insulating pattern 115 may contain an insulating material different from that of the first insulating pattern 110. For example, when the first insulating pattern 110 contains oxide (e.g., silicon oxide), the second insulating pattern 115 may contain nitride (e.g., silicon nitride).

In some embodiments, the extending length of each of the gate electrodes GSL, the word lines WL1 to WLn, and the string select line SSL in the through region THR may be greater than that of each of the gate electrodes GSL, the word lines WL1 to WLn, and the string select line SSL in the contact region CNR. For example, as shown in FIG. 8, the extending length of a particular gate electrode (e.g., the gate electrode We) exposed in the through region THR from another gate electrode (e.g., the gate electrode Wf) disposed above may be greater than that of still another gate electrode (e.g., the gate electrode Wg) exposed in the contact region CNR from the gate electrode (e.g., the gate electrode Wh) disposed there above.

In some embodiments, a lower cutting area GC may be formed to cut the ground select line GSL. As shown in FIG. 8, the lower cutting area GC may be connected to the cell gate cutting area CAC, the extension gate cutting area CNC or the through structure THV to cut the ground select line GSL. For example, three ground select lines CSL cut by the cell gate cutting area CAC, the extension gate cutting area CNC, the through structure THV, and the lower cutting area GC may be formed in two adjacent block separation areas WLC. Accordingly, the first, second and third zones I, II, and III may provide the three ground select lines GSL that are electrically separated and separately controlled.

The gate contacts 152 may be formed in the extension region EXT. The gate contacts 152 may be connected to the respective gate electrodes GSL, WL1 to WLn, and SSL. For example, the gate contacts 152 may be connected to the respective gate electrodes GSL, WL1 to WLn, and SSL while penetrating the first to third interlayer insulating films 142, 144, and 146.

In some embodiments, the gate contacts 152 may be formed in the contact region CNR of the extension region EXT. For example, as shown in FIG. 9, the gate electrodes (e.g., the gate electrodes Wa to WLn) exposed in the contact region CNR may be arranged in a stepwise manner. The gate contacts 152 may be connected to one ends of the gate electrodes (e.g., the gate electrodes Wa to WLn) that are arranged in a stair-stepped manner and exposed.

The gate contacts 152 in the general cell block BLK provide a first voltage for performing a memory operation to the respective gate electrodes GSL, WL1 to WLn, and SSL through the row decoder. The first voltage may be a memory cell read voltage Vread, a program voltage Vpgm, or an erase voltage Verase.

The first through via 154 may be formed in the through region THR of the extension region EXT. The first through via 154 may penetrate the through structure THV. For example, the first through via 154 may extend in the Z direction in the through region THR to penetrate the plurality of first insulating patterns 110 and the plurality of second insulating patterns 115.

In some embodiments, the first through via 154 may be connected to the gate contact 152. For example, a connecting wiring 156 may be formed on the third interlayer insulating film 146. The gate contact 152 and the first through via 154 may be connected to the connecting wiring 156 while penetrating the first to third interlayer insulating films 142, 144, and 146. Accordingly, the connecting wiring 156 may connect the gate contact 152 and the first through via 154.

In some embodiments, a second substrate 200 and a peripheral circuit element PT may be formed under the first substrate 100.

The second substrate 200 may include, for example, a semiconductor substrate such as a silicon substrate, a germanium substrate, or a silicon-germanium substrate. Alternatively, the second substrate 200 may include a silicon-on-insulator (SOI) substrate or a germanium-on-insulator (GOI) substrate.

The peripheral circuit element PT may be formed on the second substrate 200. The peripheral circuit element PT may constitute a peripheral circuit (e.g., 30 in FIG. 1) that controls an operation of each memory cell.

The peripheral circuit element PT may include, for example, a transistor, but is not limited thereto. For example, the peripheral circuit element PT may include various active elements such as a transistor, as well as various passive elements such as a capacitor, a resistor, and an inductor.

In some embodiments, the first through via 154 may be connected to the peripheral circuit element PT. For example, a fourth interlayer insulating film 240 that covers the peripheral circuit element PT and a peripheral circuit wiring PW in the fourth interlayer insulating film 240 may be formed on the second substrate 200. The first through via 154 may be connected to the peripheral circuit element PT by the peripheral circuit wiring PW. The peripheral circuit wiring PW may be implemented in a plurality of lower metal layers.

Figure 11:
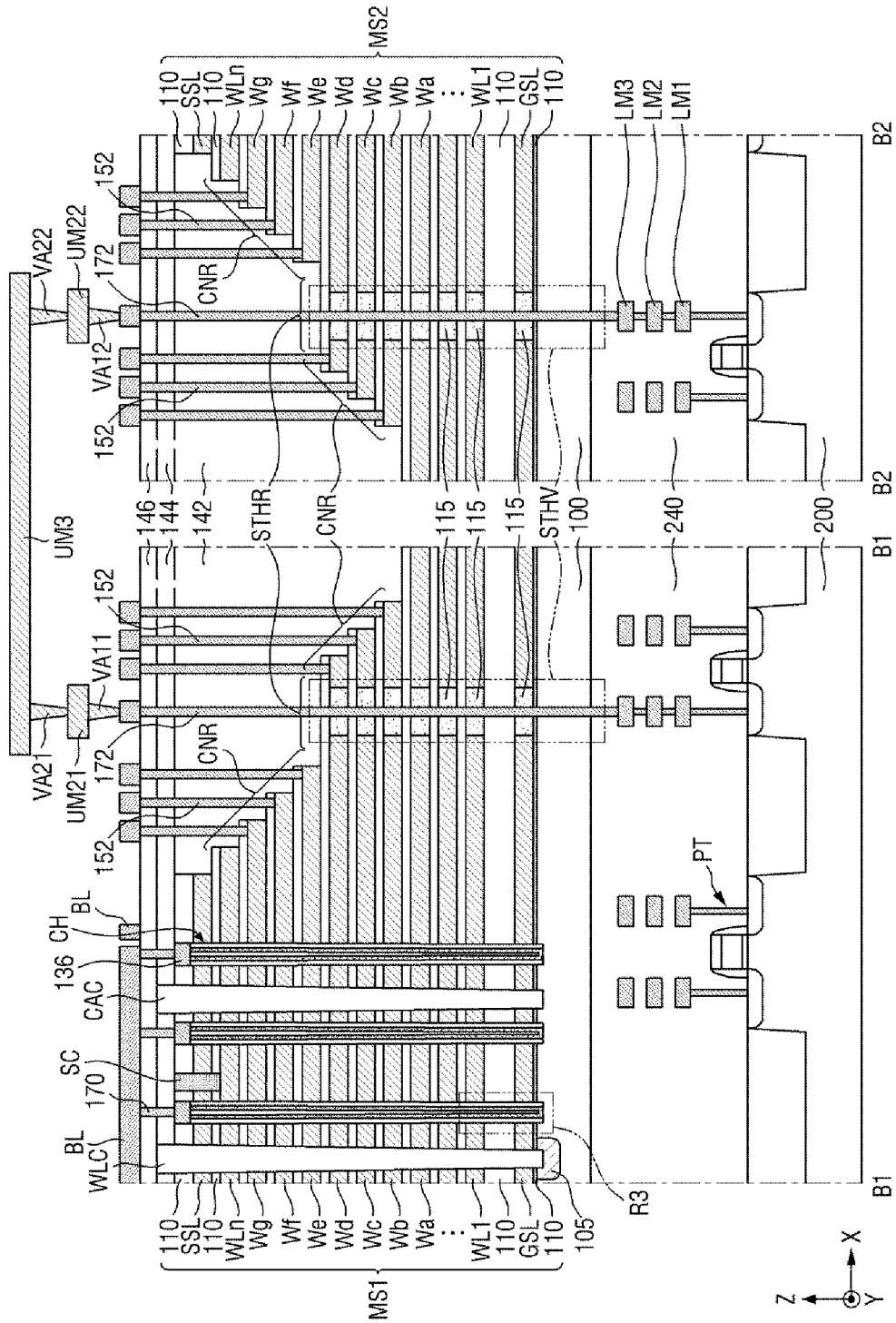
Figure 12:
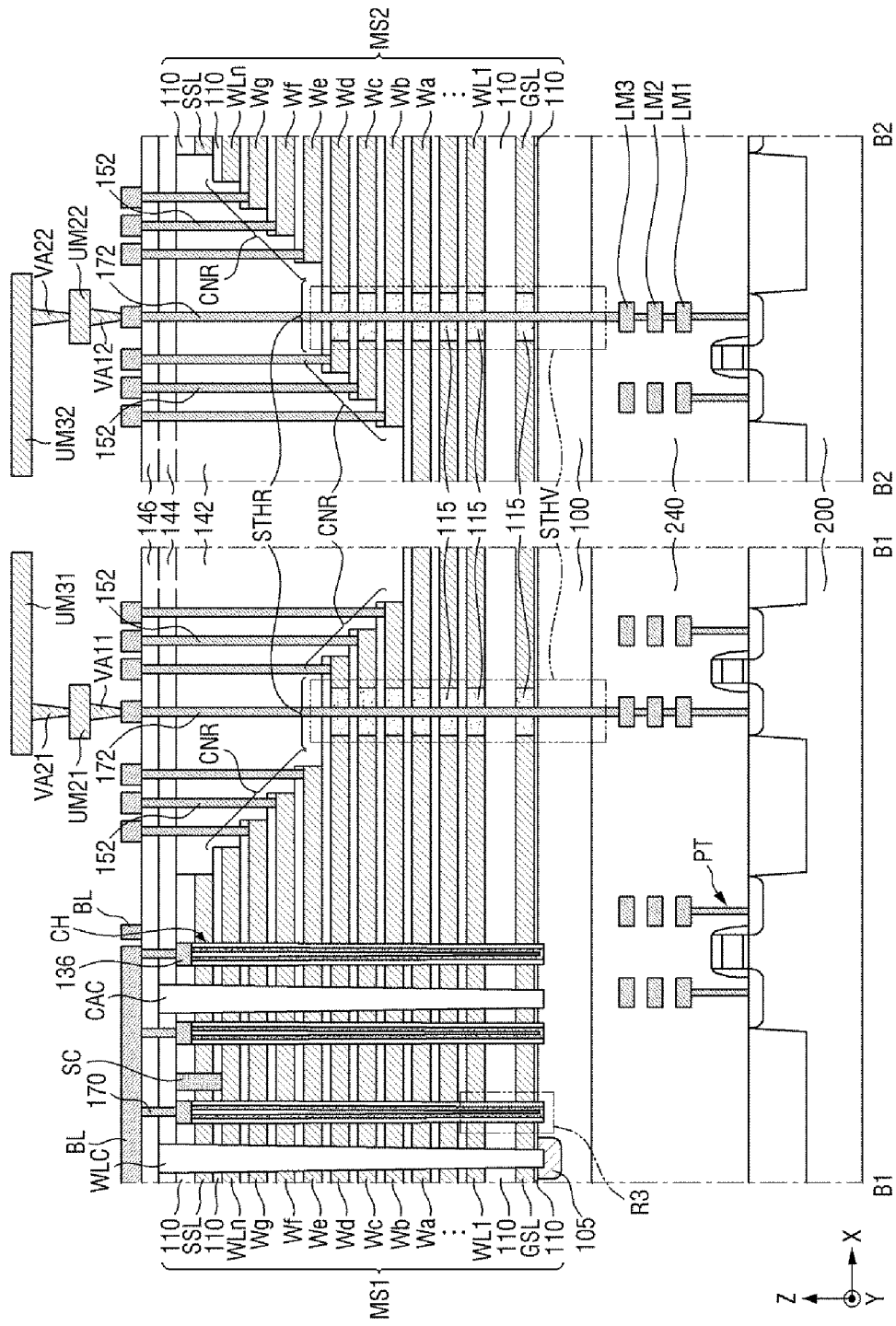

FIG. 10 is a plan view of a layout diagram further illustrating the area R2 indicated in FIG. 6, and FIGS. 11 and 12 are respective cross-sectional diagram taken along line B-B of FIG. 10. Here, only material differences between FIGS. 8 and 9 verses FIGS. 10 and 11 will be described.

Referring to FIGS. 6, 10 and 11, the area R2 includes the cell region CELL and the extension region EXT of the mold structure MS in two adjacent block separation areas WLC. The dummy block may be any one of the plain top/bottom dummy blocks TD and BD, the common source line tapping dummy block CSLTD, the bit line through structure dummy block BLTD in some embodiments.

The cell region CELL of the dummy block may be implemented in the same manner as the general cell block BLK described with reference to FIGS. 8 and 9. However, the gap between two adjacent block isolation areas WLC of the dummy block may be smaller than the gap between two adjacent block isolation areas WLC of the general cell block BLK.

In some embodiments, the dummy block may not have the cutting structure SC for cutting the string select line SSL and the cell gate cutting area CAC for cutting the cell region CELL. In some embodiments, the dummy block may have the cut structure SC for cutting the string select lines SSL of which number is smaller than that of the general cell blocks BLK, and the cell gate cutting area CAC for cutting the cell region CELL.

The extension region EXT of the dummy block may include the contact region CNR and the extension through region STHR. The contact region CNR and the extension through region STHR may be arranged alternately along the direction in which the block separation area WLC extends. For example, the contact region CNR and the extension through region STHR may be arranged alternately along the X direction.

The contact region CNR of the dummy block may be implemented in the same manner as the contact region CNR of FIG. 9. The gate contacts 152 connected to the respective gate electrodes GSL, WL1 to WLn, and SSL may be formed in the contact region CNR.

In some embodiments, the gate contacts 152 may be formed in the contact area CNR of the extension region EXT. For example, as shown in FIG. 10, the gate electrodes (e.g., the gate electrodes Wa to WLn) exposed in the contact region CNR may be arranged in a stair-stepped manner. The gate contacts 152 may be connected to one ends of the gate electrodes (e.g., the gate electrodes Wa to WLn) arranged in a stair-stepped manner and exposed. A predetermined voltage Vs may be applied to the gate contacts 152 of the dummy block through the low decoder.

The extension through structure STHV may be formed in the extension through region STHR of the dummy block. The extension through structure STHV may include the plurality of second insulating patterns 115 that are stacked on the first substrate 100 while being spaced apart from each other, similarly to the second insulating patterns 115 of the general cell block. For example, each of the second insulating patterns 115 may be a layered structure extending in the X direction and the Y direction.

The second insulating patterns 115 may be stacked at the same level as at least one of the gate electrodes GSL, word lines WL1 to WLn, and the string select line SSL. The second insulating patterns 115 in the extension through region STHR and the first insulating patterns 110 may be alternately stacked. In other words, the second insulating patterns 115 may cut the gate electrodes GSL, the word lines WL1 to WLn, and the string select line SSL in the extension through region STHR.

The extension through via 172 may be formed in the extension through region STHR of the extension region EXT. The extension through via 172 may penetrate the extension through structure STHV. For example, the extension through via 172 may extend in the Z direction in the extension through region STHR to penetrate the first insulating patterns 110 and the second insulating patterns 115.

In some embodiments, one end of the extension through via 172 may be electrically connected to upper metal lines UMs. For example, the extension through via 172 may be connected to a first upper metal line UM11 on the interlayer insulating film 146 and electrically connected to the third upper metal line UM3 through a first via VA11, a second upper metal line UM21, and a second via VA21.

In some embodiments, the other end of the extension through via 172 may be connected to one of the peripheral circuit wirings PW, i.e. a lower metal line LM. The extension through via 172 may be connected to the lower metal line LM in the interlayer insulating film 240 and connected to the pass transistor PT of the peripheral circuit element. For example, the extension through via 172 may be electrically connected to the peripheral circuit element PT through a top lower metal line LM3, an intermediate lower metal line LM2, and a bottom lower metal line LM1.

The extension through via 172 of the dummy block in a first mold structure MS1 may transfer the target signal generated by the peripheral circuit element PT to the upper metal line UM, and the upper metal line UM may transfer the target signal to a second mold structure MS2 different from the first mold structure MS1.

In some embodiments, a target signal SI may be a signal supplied by the common source line CSL or a power supply. Thus, the target signal may be provided as a common source line signal to the source line of the ground select transistor of an adjacent block. In one example, the target signal may be a power supply signal shared by the cell block and the dummy block.

In some embodiments, the semiconductor memory device 10 may transfer any one signal generated by the peripheral circuit element PT of the first plane PL1 to the dummy block of the second plane PL2 through the lower metal line LM, the extension through via 172, and the upper metal line UM, as shown in FIG. 11.

In some embodiments, the semiconductor memory device 10 may connect any one signal generated by the peripheral circuit element of each plane to different signal paths through the lower metal line LM, the extension through via 172, and the upper metal lines UM31 and UM32, as shown in FIG. 12. For example, the upper metal line UM31 of the first sub-peripheral region PL1 may be connected to an input pad and the upper metal line UM32 of the second sub-peripheral region PL2 may be connected to an output pad.

Figure 13:
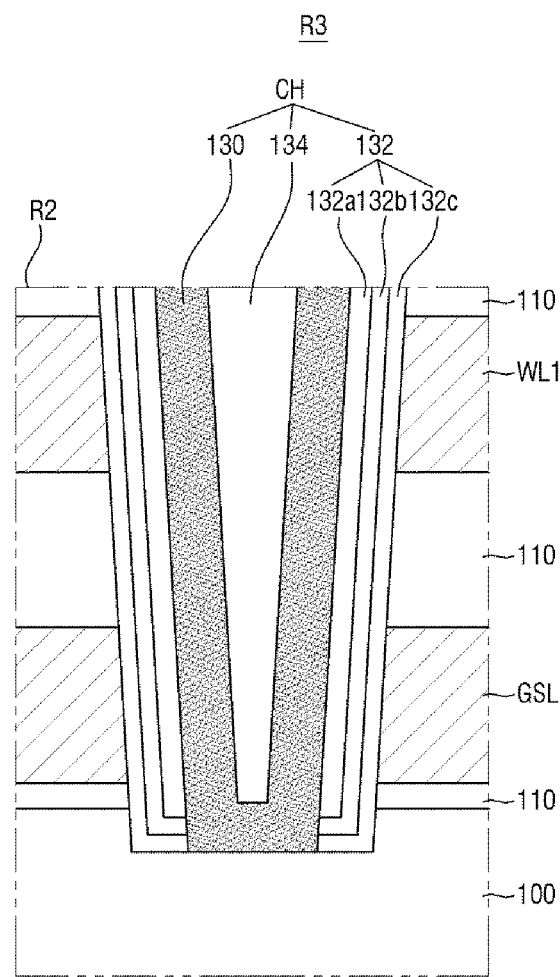
FIGS. 13 and 14 are respective, cross-sectional diagrams further illustrating the area 'R3' indicated in FIGS. 8 and 10.

FIG. 13 is an enlarged view further illustrating the area R3 indicated in FIGS. 8 and 10.

As shown in FIG. 13, the channel structure CH may include a semiconductor pattern 130 and an information storage film 132. The semiconductor pattern 130 may extend in the third direction Z to penetrate the mold structure MS. The semiconductor pattern 130 is shown in a cup shape, but this is merely exemplary. For example, the semiconductor pattern 130 may have various shapes such as a cylindrical shape, a rectangular tube shape, and a solid pillar shape.

The semiconductor pattern 130 may include, for example, a semiconductor material such as monocrystalline silicon, polycrystalline silicon, organic semiconductor material, and carbon nanostructure, but is not limited thereto.

The information storage film 132 may be interposed between the semiconductor pattern 130 and each of the gate electrodes GSL, WL1 to WLn, and SSL. For example, the information storage film 132 may extend along a side surface of the semiconductor pattern 130.

The information storage film 132 may include, for example, at least one of silicon oxide, silicon nitride, silicon oxynitride, or a high dielectric constant material having a higher dielectric constant than silicon oxide. The high dielectric constant material may include, for example, at least one selected from the group consisting of aluminum oxide, hafnium oxide, lanthanum oxide, tantalum oxide, titanium oxide, lanthanum hafnium oxide, lanthanum aluminum oxide, dysprosium scandium oxide and a combination thereof.

In some embodiments, the information storage film 132 may be formed of multiple films. For example, the information storage film 132 may include a tunnel insulating film 132a, a charge storage film 132b, and a blocking insulating film 132c which are sequentially stacked on the semiconductor pattern 130.

The tunnel insulating film 132a may include, for example, silicon oxide or a high dielectric constant material (e.g., aluminum oxide ($Al_2O_3$) or hafnium oxide ($HfO_2$)) having a higher dielectric constant than silicon oxide. The charge storage layer 132b may include, for example, silicon nitride. The blocking insulating film 132c may include, for example, silicon oxide or a high dielectric constant material (e.g., aluminum oxide ($Al_2O_3$) or hafnium oxide ($HfO_2$)) having a higher dielectric constant than silicon oxide.

In some embodiments, the channel structure CH may further include a filling pattern 134. The filling pattern 134 may be formed to fill an interior of the semiconductor pattern 130 having a cup shape. For example, the semiconductor pattern 130 may extend along the side and bottom surfaces of the filling pattern 134. The filling pattern 134 may include an insulating material, e.g., silicon oxide, but is not limited thereto.

Figure 14:
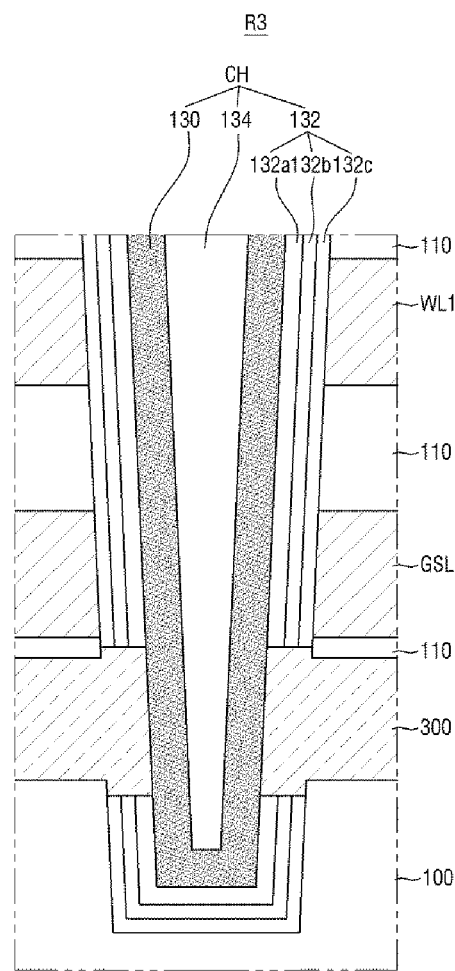

FIG. 14 is an enlarged view further illustrating the area R3 indicated in FIGS. 8 and 10.

Referring to FIGS. 8, 10 and 14, the semiconductor memory device according to some embodiments may further include a source structure 300.

The source structure 300 may be formed on the first substrate 100. In some embodiments, the source structure 300 may be interposed between the first substrate 100 and the mold structure MS. The source structure 300 may contain, e.g., metal or polysilicon doped with impurities.

In some embodiments, the channel structure CH may be connected to the first substrate 100 while penetrating the source structure 300. For example, as shown in FIG. 14, the lower portion of the channel structure CH may be embedded in the first substrate 100 while penetrating the source structure 300.

In some embodiments, the source structure 300 may be formed to be connected to the semiconductor pattern 130 of the channel structure CH. For example, the source structure 300 may be connected to the semiconductor pattern 130 while penetrating a part of the information storage film 132.

In some embodiments, part of the source structure 300 adjacent to the semiconductor pattern 130 may have a shape projecting toward the information storage film 132. For example, the length of the source structure 300 extending in the third direction Z may be further increased in the region adjacent to the semiconductor pattern 130. This may be due to the characteristics of an etching process for removing a part of the information storage film 132 to form the source structure 300.

Accordingly, it is possible to provide a method for fabricating a semiconductor memory device with improved integration density and reliability.

Here, it should be noted that those skilled in the art will appreciate that many variations and modifications may be made to the foregoing embodiments without departing from the scope of the following claims.

What is claimed is:

1. A semiconductor memory device comprising:
a mold structure including gate electrodes stacked on a first substrate;
a channel structure that penetrates a first region of the mold structure;
a first through structure that penetrates a second region of the mold structure; and
a second through structure that penetrates a third region of the mold structure,
wherein the mold structure further includes:
memory cell blocks extending in a first direction and spaced apart in a second direction; and
a dummy block extending in the first direction and disposed between the memory cell blocks, wherein each of the memory cell blocks and the dummy block includes a cell region and an extension region arranged in the first direction, the first region is a cell region of one of the memory cell blocks, the second region is an extension region of the one of the memory cell blocks, and the third region is an extension region of the dummy block.

2. The semiconductor memory device of claim 1, wherein the extension region of the dummy block and the extension regions of the memory cell blocks each include contact regions and through regions alternately arranged in the first direction, and
the first through structure penetrates the mold structure in a through region of the extension region of the memory cell blocks, and
the second through structure penetrates the mold structure in a through region of the extension region of the dummy block.

3. The semiconductor memory device of claim 2, wherein the through regions are spaced apart and include insulating patterns stacked on the first substrate and arranged at the same level as the gate electrodes.

4. The semiconductor memory device of claim 1, wherein the first through structure is one of a bit line through structure and a common source line (CSL) tapping through structure.

5. The semiconductor memory device of claim 1, further comprising:
an upper metal line disposed on the mold structure;
a second substrate stacked on the first substrate and including peripheral circuit elements; and
a lower metal line stacked on the peripheral circuit elements,
wherein the second through structure penetrates the first substrate to electrically connect the upper metal line and the lower metal line, whereby a target signal is transmitted through the upper metal line connected to the third region.

6. The semiconductor memory device of claim 5, wherein the target signal is a power signal.

7. The semiconductor memory device of claim 5, wherein the target signal is a CSL signal.

8. The semiconductor memory device of claim 1, wherein the dummy block is one of a top dummy block, a bottom dummy block, a CSL tapping dummy block, and a bit line through structure dummy block.

9. A semiconductor memory device comprising:
a first mold structure stacked on a first substrate;
an upper metal line disposed on the first mold structure;
a second substrate disposed under the first substrate and including peripheral circuit elements; and
a lower metal line disposed on the peripheral circuit elements,
wherein the first mold structure includes first memory cell blocks and a first dummy block, the first dummy block includes a cell region and an extension region including a contact region and an extension through region arranged in a first direction, and a first extension through via penetrating the extension through region to connect the upper metal line and the lower metal line, whereby a target signal from one of the peripheral circuit elements is transmitted to the upper metal line.

10. The semiconductor memory device of claim 9, wherein the dummy block is one of a top dummy block, a bottom dummy block, a common source line (CSL) tapping dummy block, and a bit line through structure dummy block.

11. The semiconductor memory device of claim 9, wherein the first mold structure includes gate electrodes and first insulating patterns alternately stacked on the first substrate, and
the extension through region includes second insulating patterns disposed at the same level as the gate electrodes and the first insulating patterns.

12. The semiconductor memory device of claim 9, further comprising:
a second mold structure spaced apart from the first mold structure and stacked on the first substrate, wherein the second mold structure shares the target signal through a second extension through via connected to the upper metal line.

13. The semiconductor memory device of claim 9, wherein the target signal is a CSL signal supplied through the lower metal line and provided to a source line of a ground select transistor of one of the first memory cell blocks.

14. The semiconductor memory device of claim 9, wherein the target signal is a power supply signal supplied from the first dummy block to a power circuit of the first memory cell blocks.

15. A semiconductor memory device comprising:
mold structures stacked on a first substrate and spaced apart from each other, wherein each of the mold structures includes gate electrodes and first insulating patterns alternately stacked;
block cutting areas extending in a first direction and separating the mold structures into memory cell blocks and a dummy block, wherein each of the memory cell blocks and the dummy block includes a cell region and an extension region;
channel structures that penetrate one of the mold structures in the cell region of the memory cell block and the dummy block;
through structures that penetrate the one of the mold structures in the extension region of the memory cell block;
extension through structures that penetrate the one of the mold structures in the extension region of the dummy block;
a second substrate including peripheral circuit elements respectively corresponding to the mold structures; and
lower metal lines disposed between the peripheral circuit elements and the first substrate,
wherein both one end of the extension through structure is connected to an upper metal line and another end of the extension through structure is connected to one of the lower metal lines to transmit a target signal to each one of the peripheral circuit elements.

16. The semiconductor memory device of claim 15, wherein the target signal is shared by the extension through structure of a first mold structure among the mold structures and the extension through structure of a second mold structure among the mold structures.

17. The semiconductor memory device of claim 15, wherein the extension region of each of the memory cell blocks and the dummy block includes:
a contact region in which a gate electrode among the gate electrodes connects a gate contact; and
a through region,
wherein the through structures are disposed in respective through regions of the extension regions of the memory cell blocks, and
wherein the extension through structure is disposed in the through region of the extension region of the dummy block.

18. The semiconductor memory device of claim 17, wherein the extension through structure includes an extension through via that penetrates the through region and is connected between the upper metal line and the lower metal line.

19. The semiconductor memory device of claim 15, wherein the target signal is a common source line (CSL) signal supplied through the lower metal line and provided to a source line of a ground select transistor of one of the memory cell blocks.

20. The semiconductor memory device of claim 15, wherein the dummy block is one of a top dummy block, a bottom dummy block, a CSL tapping dummy block, and a bit line through structure dummy block.

* * * * *